United States Patent
Lin et al.

(10) Patent No.: US 9,831,167 B1
(45) Date of Patent: Nov. 28, 2017

(54) COMPOUND CARRIER BOARD STRUCTURE OF FLIP-CHIP CHIP-SCALE PACKAGE AND MANUFACTURING METHOD THEREOF

(71) Applicant: KINSUS INTERCONNECT TECHNOLOGY CORP., Taoyuan (TW)

(72) Inventors: Ting-Hao Lin, Taoyuan (TW); Yi-Fan Kao, Taoyuan (TW); Shuo-Hsun Chang, Taoyuan (TW); Yu-Te Lu, Taoyuan (TW); Kuo-Chun Huang, Taoyuan (TW)

(73) Assignee: KINSUS INTERCONNECT TECHNOLOGY CORP., Shin-Wu Shiang, Taoyuan County (TW)

( * ) Notice: Subject to any disclaimer, the term of this patent is extended or adjusted under 35 U.S.C. 154(b) by 0 days.

(21) Appl. No.: 15/678,130

(22) Filed: Aug. 16, 2017

Related U.S. Application Data

(63) Continuation-in-part of application No. 15/071,368, filed on Mar. 16, 2016, now Pat. No. 9,754,870, which is a continuation-in-part of application No. 13/938,335, filed on Jul. 10, 2013, now Pat. No. 9,406,641.

(51) Int. Cl.
| | | |
|---|---|---|
| H01L 23/498 | (2006.01) | |
| H01L 23/31 | (2006.01) | |
| H01L 23/13 | (2006.01) | |
| H01L 23/00 | (2006.01) | |
| H01L 21/56 | (2006.01) | |
| H01L 23/538 | (2006.01) | |

(Continued)

(52) U.S. Cl.
CPC ...... *H01L 23/49833* (2013.01); *H01L 21/486* (2013.01); *H01L 21/4857* (2013.01); *H01L 21/565* (2013.01); *H01L 23/13* (2013.01); *H01L 23/3114* (2013.01); *H01L 23/3142* (2013.01); *H01L 23/367* (2013.01); *H01L 23/49811* (2013.01); *H01L 23/49827* (2013.01); *H01L 23/49838* (2013.01); *H01L 23/5389* (2013.01); *H01L 24/16* (2013.01); *H01L 24/81* (2013.01); *H01L 2224/16227* (2013.01); *H01L 2924/3511* (2013.01)

(58) Field of Classification Search
USPC .......................... 174/258; 439/330; 206/103
See application file for complete search history.

(56) References Cited

U.S. PATENT DOCUMENTS

| | | | | |
|---|---|---|---|---|
| 5,835,355 A | * | 11/1998 | Dordi | ........... H01L 21/563 174/252 |
| 6,396,136 B2 | * | 5/2002 | Kalidas | ........ H01L 23/49816 257/691 |

(Continued)

*Primary Examiner* — William H Mayo, III
*Assistant Examiner* — Krystal Robinson
(74) *Attorney, Agent, or Firm* — Idea Intellectual Limited; Margaret A. Burke; Sam T. Yip

(57) ABSTRACT

A compound carrier board structure of Flip-Chip Chip-Scale Package and manufacturing method thereof provides a baseplate with an opening bonded to a carrier board in order to form a compound carrier board structure. A die is placed in the opening and bonded to the carrier board. A sealant is filled in a gap between surrounding walls of the opening and the die at a height lower than the die to fixedly place the die within the opening and to leave a non-active surface of the die exposed.

18 Claims, 12 Drawing Sheets

(51) Int. Cl.
*H01L 21/48* (2006.01)
*H01L 23/367* (2006.01)

(56) References Cited

U.S. PATENT DOCUMENTS

| | | | |
|---|---|---|---|
| 7,894,203 B2* | 2/2011 | Kariya | H01L 23/49827 361/763 |
| 2003/0100212 A1* | 5/2003 | Kung | H05K 3/4038 439/330 |

* cited by examiner

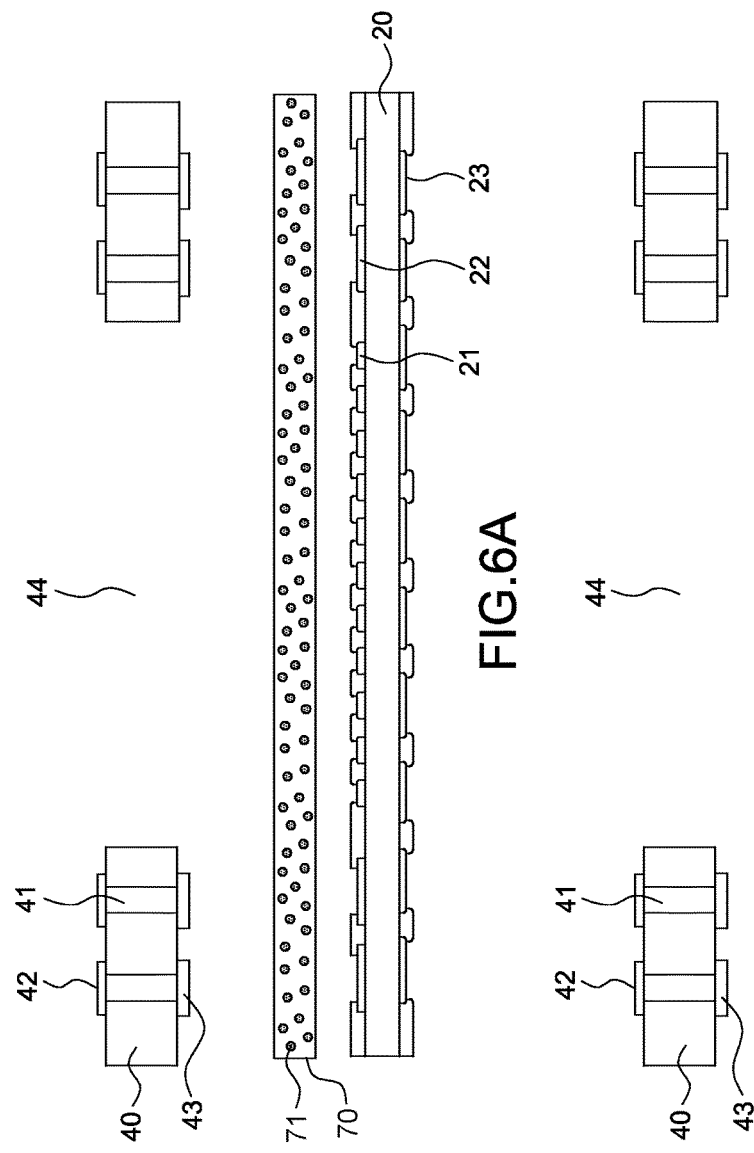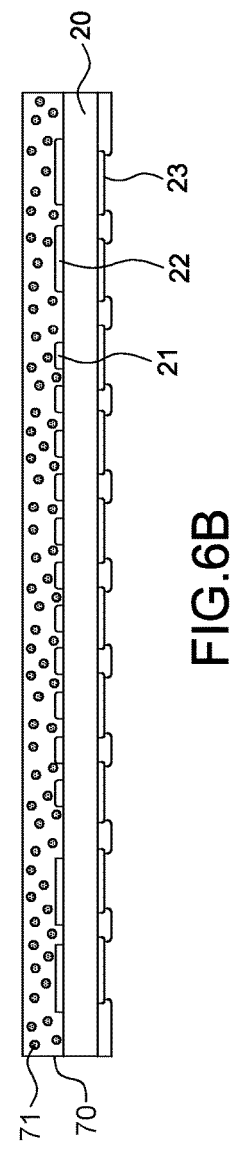
FIG.6A
FIG.6B

COMPOUND CARRIER BOARD STRUCTURE OF FLIP-CHIP CHIP-SCALE PACKAGE AND MANUFACTURING METHOD THEREOF

CROSS-REFERENCE TO RELATED APPLICATIONS

This patent application is a continuation-in-part application of non-provisional application Ser. No. 13/938,335 filed on Jul. 10, 2013 and Ser. No. 15/071,368 filed on Mar. 16, 2016, the disclosures of which are incorporated herein in their entirety by reference.

FIELD OF INVENTION

This disclosure relates to a compound carrier board structure of Flip-Chip Chip-Scale Package, particularly to a compound carrier board structure for enhancing mechanical strength and heat dissipation.

BACKGROUND

There are two conventional methods for manufacturing Flip-Chip Chip-Scale Package as shown in FIGS. 1A to 1D and 2A to 2D. The Flip-Chip Chip-Scale Package, a three dimension package technology strides toward high-power, high-density and lightweight miniaturized to meet the demand for communication products. Basically, the manufacturing method can be divided into two stages, carrier board stage and package stage. When a die is formed to be a package structure after the two stages, the package structure can be a main structure of a package-on-package, up or down connecting to other package structure or printed circuit boards.

With the referenced to FIGS. 1A to 1D, the package stage of the Flip-Chip Chip-Scale Package includes the steps below:

a) providing a carrier board 10 larger or equaling to 150 um having a plurality of first and second contact points 11, 12 at an upper surface thereof and a third contact point 13 at a lower surface thereof; having the second contact point 12 located around the first contact points 11 and planting a first ball 16 at the second contact point 12;

b) providing at least one die 14 having an active surface 141 and a non-active surface 142; providing a plurality of dumps 143 arranged at the active surface 141 and bonded to the first contact point 11; reflowing the carrier board 10 with die 14 through a flux for fixing the die 14 on the carrier board 10; removing the flux after finishing reflowing and utilizing capillary to underfill a primer 15 between the die 14 and the carrier board 10;

c) providing a first ball 16 mounted to the second contact point 12; over laying the first ball 16 and the die 14 by a package molding material 17 for package molding;

d) providing a second ball 18 mounted to the third contact point 13 and conducting Through Mild Via at a predetermined position of the package molding material 17 by laser for presenting an exposed state at a top of the first ball 16.

With the referenced to FIGS. 2A to 2D, the package stage of the Flip-Chip Chip-Scale Package includes the steps below:

a) providing a carrier board 10 larger or equaling to 150 um having a plurality of first and second contact points 11, 12 at an upper surface thereof and a third contact point 13 at a lower surface thereof; having the second contact point 12 located around the first contact points 11 and planting a first ball 16 at the second contact point 12;

b) providing at least one die 14 having an active surface 141 and a non-active surface 142; providing a plurality of dumps 143 arranged at the active surface 141 and bonded to the first contact point 11; reflowing the carrier board 10 with die 14 through a flux for fixing the die 14 on the carrier board 10 and removing the flux after finishing reflowing;

c) providing package molding material 17 over laying the first ball 16 and bonding to both sides of the die 14 and between the die 14 and the carrier board 10 to present an exposed state at an upper surface of the die 14 for package molding;

d) providing a second ball 18 mounted to the third contact point 13 and conducting Through Mild Via at a predetermined position of the package molding material 17 by laser for presenting an exposed state at a top of the first ball 16.

The above two manufacturing methods of the Flip-Chip Chip-Scale Package use the Through Mild Via structure as the mainstream of the Flip-Chip Chip-Scale Package products. Due to the supporting action while reflowing and the warpage problems of the carrier board 10, the core thickness of the carrier board 10 requires more than 150 um, resulting in the fact that the total thickness of the carrier board 10 cannot be reduced and therefore the Through Mild Via structure formed by the method of the Flip-Chip Chip-Scale Package hinders the total thickness of the package products of the Package-on-Package from continuously declining, being unable to meet future demands of miniaturization. Therefore, there is a still room for improvements.

Also, in U.S. Pat. No. 5,521,435, Mizukoshi disclosed a semiconductor device including a package baseplate 40, a semiconductor chip on the package baseplate 40, a jumper baseplate 40 carrying electrodes thereon and conductor patterns that connect the electrodes. The jumper baseplate 40 is mounted upon the package baseplate 40 to provide an interconnection between the electrode patterns on an upper surface of the package baseplate 40 in electrical connection with the electrode pads on the semiconductor chip and the electrodes that are isolated corresponding to a plurality of through-holes arranged on the package baseplate 40. The semiconductor device further has an opening filled with resin to encapsulate the semiconductor chip.

SUMMARY OF INVENTION

It is a primary object of this disclosure to provide a compound carrier board structure to enhance the mechanical strength and reduce warpage problems of the carrier board.

It is another object of this disclosure to provide a baseplate for strengthening the heat dissipation of the compound carrier board structure in order to reduce warpage problems of the carrier board.

In order to achieve the above objects, this disclosure provides a manufacturing method of the compound carrier board structure of Flip-Chip Chip-Scale Package, and the manufacturing method comprises steps of:

providing a carrier board with a thickness less than 150 um, having a plurality of first and second contact points at an upper surface thereof, the second contact points being located around the first contact points;

providing an anisotropic conductive film onto the upper surface of the carrier board, wherein the anisotropic conductive film having a plurality of conductive particles distributed therein at mutually spaced positions, and portions of the anisotropic conductive film being compressed is conductive while the other portions being uncompressed remains non-conductive;

providing a baseplate, having a plurality of electrical conductive bodies passing therethrough and an opening the baseplate at the center of the baseplate, forming a plurality of surrounding walls within the opening, the electrical conductive bodies having upper and lower ends respectively exposed at an upper surface and lower surface of the baseplate and electrically connected to lower surfaces of a plurality of first electrode pads and upper surfaces of a plurality of second electrode pads;

pressing the baseplate against the anisotropic conductive film with the lower surfaces of the second electrode pads aligned with the second contact points respectively, to allow the anisotropic conductive film having portions compressed between the second electrode points of the carrier board and the second electrode pads of the baseplate, and the surrounding walls of the opening arranged around the first contact points;

providing at least one die having an active surface and a corresponding non-active surface;

pressing the die into the opening of the baseplate and against the anisotropic conductive film with the dumps aligned with the first contact points respectively, to allow the anisotropic conductive film having portions compressed between the first electrode point of the carrier board and the dumps of the die; and providing a sealant material filled in a gap between the surrounding walls of the opening and the die at a height lower than the die to fixedly place the die within the opening and to leave the non-active surface exposed.

This disclosure also discloses a compound carrier board structure of Flip-Chip Chip-Scale Package, and the compound carrier board structure comprises a carrier board, an anisotropic conductive film, a baseplate, at least one die, and a sealant.

The carrier board is equipped with a thickness less than 150 um, and has a plurality of first and second contact points at an upper surface thereof; the second contact points are located around the first contact points. The anisotropic conductive film is disposed onto the upper surface of the carrier board, and has a plurality of conductive particles distributed in the anisotropic conductive film at mutually spaced positions; wherein portions of the anisotropic conductive film being compressed is electrical conductive while the other portions being uncompressed remains electrical non-conductive. The baseplate has a plurality of electrical conductive bodies passing therethrough and an opening the baseplate at the center of the baseplate, forming a plurality of surrounding walls within the opening, the electrical conductive bodies have upper and lower ends respectively exposed at an upper surface and lower surface of the baseplate and electrically connected to lower surfaces of a plurality of first electrode pads and upper surfaces of a plurality of second electrode pads; wherein the baseplate is compressed against the anisotropic conductive film with the lower surfaces of the second electrode pads aligned with the second contact points respectively, to allow the anisotropic conductive film having portions compressed between the second electrode points of the carrier board and the second electrode pads of the baseplate, and the surrounding walls of the opening arranged around the first contact points. The die has an active surface having a plurality of dumps and a corresponding non-active surface; wherein the die is compressed into the opening of the baseplate and against the anisotropic conductive film with the dumps aligned with the first contact points respectively, to allow the anisotropic conductive film having portions compressed between the first electrode point of the carrier board and the dumps of the die. The sealant material is filled in a gap between the surrounding walls of the opening and the die at a height lower than the die to fixedly place the die within the opening and leave the non-active surface exposed.

This disclosure provides a baseplate with heat-dissipation function and conduction and lap joint functions through the first and second electrode pads of the electrical conductive body, reducing modeling paste through-hole process. The film region of the baseplate also has heat-dissipation function. The carrier board, non-conductive film baseplate and carrier board together form the compound structure with mechanical strength. When the diet is planted in the film region to conduct the package process, it is difficult to cause the warpage problems of the thin carrier board, achieving thin type and heat strengthening and enhancing the mechanical strength.

BRIEF DESCRIPTION OF THE DRAWINGS

FIG. 6A is a schematic view illustrating a carrier board, an anisotropic conductive film and a baseplate before combination according to a third embodiment of this disclosure;
FIG. 6B is a schematic view illustrating the anisotropic conductive film disposed onto the upper surface of the carrier board according to a third embodiment of this disclosure.

DETAILED DESCRIPTION

Referring to FIGS. 3A-3F, a compound carrier board structure of Flip-Chip Chip-Scale Package and manufacturing method thereof in accordance with a first embodiment of this disclosure is divided into a carrier board process and a package process.

Figure 1A:
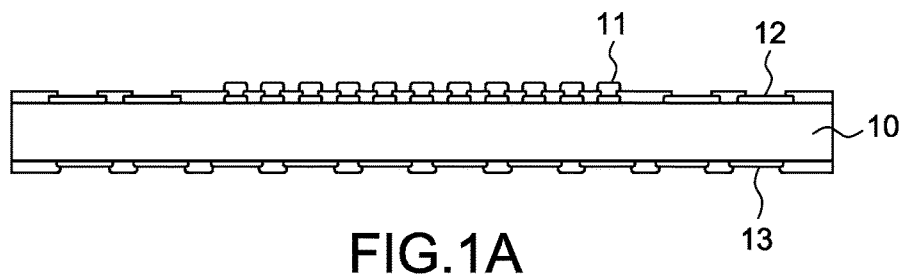
FIG. 1A is a schematic view of a carrier board in the art.
Figure 1B:
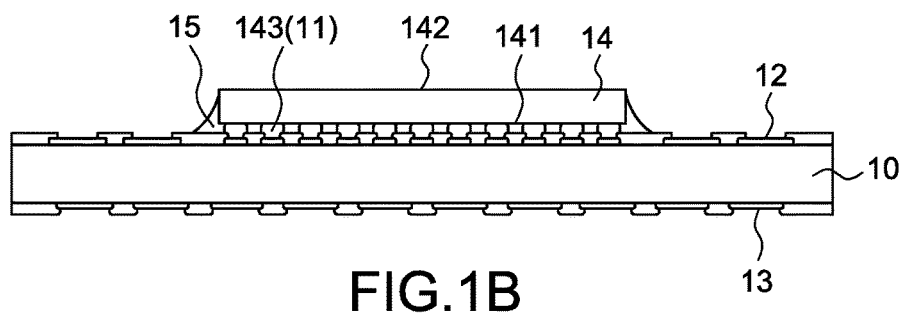
FIG. 1B is a schematic view of a die mounted on the carrier in the art.
Figure 1C:
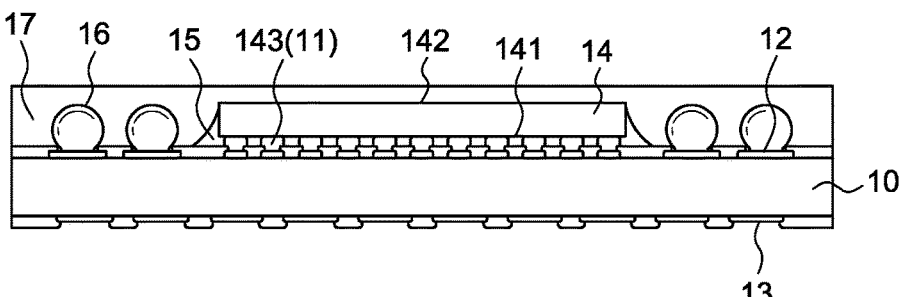
FIG. 1C is a schematic view of a package molding in the art.
Figure 1D:
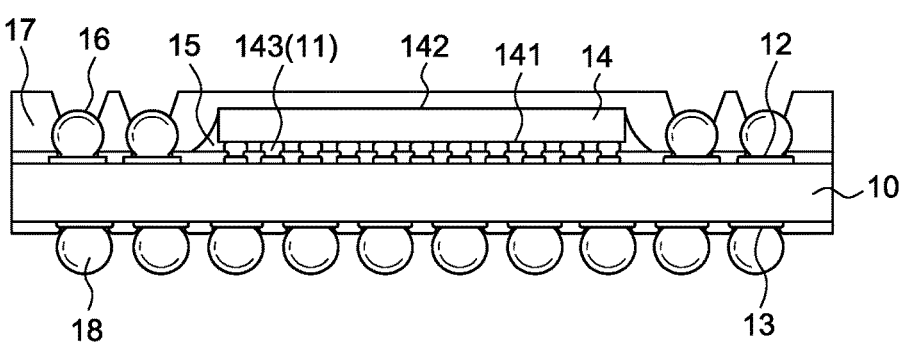
FIG. 1D is a schematic view of a laser Through Mold Via in the art.
Figure 2A:
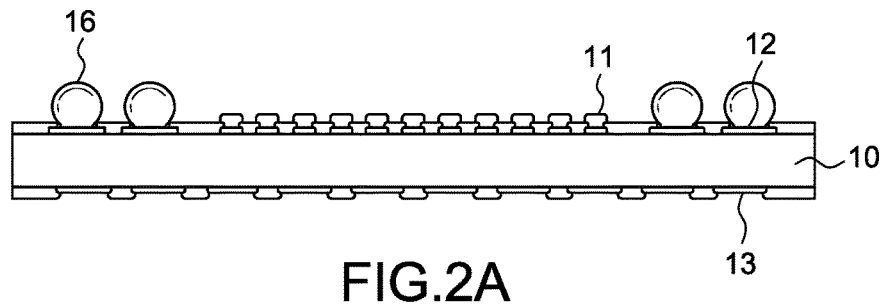
FIG. 2A is a schematic view of a carrier board with ball-planting in advance in the art.
Figure 2B:
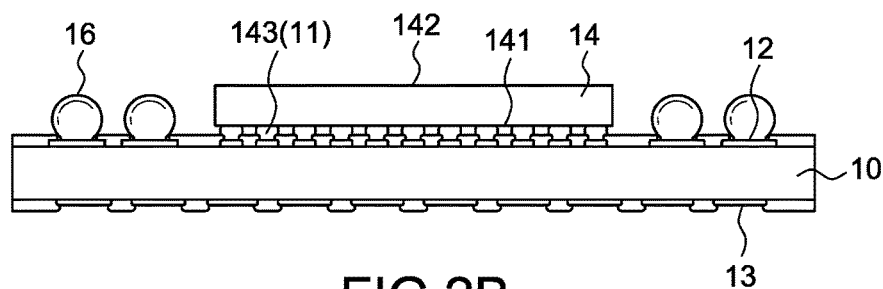
FIG. 2B is a schematic view of a die mounted on the carrier in the art.
Figure 2C:
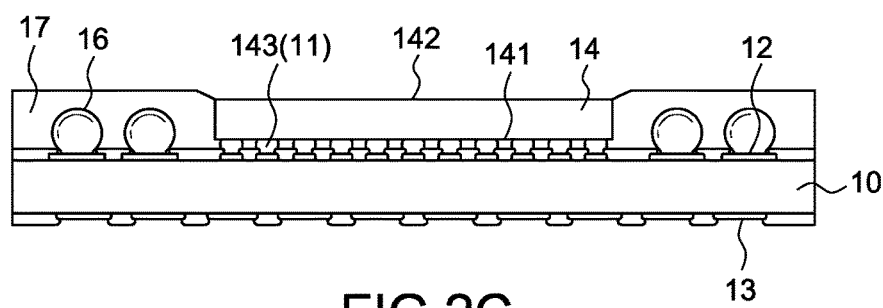
FIG. 2C is a schematic view of a package molding in the art.
Figure 2D:
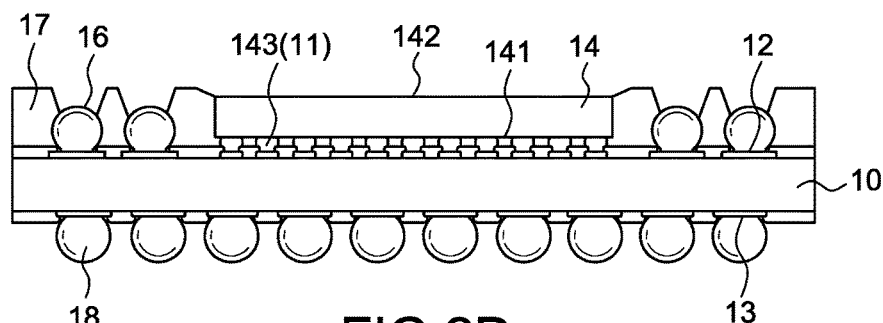
FIG. 2D is a schematic view of a laser Through Mold Via in the art.
Figure 3A:
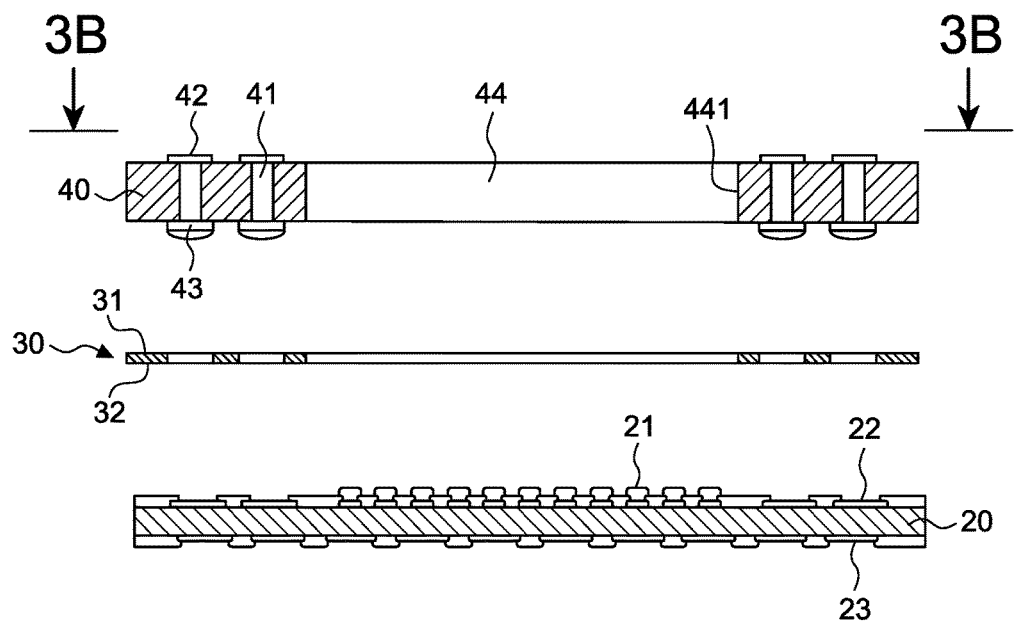
FIG. 3A is a schematic view illustrating a carrier board and a baseplate before combination according to the first embodiment of this disclosure.
Figure 3C:
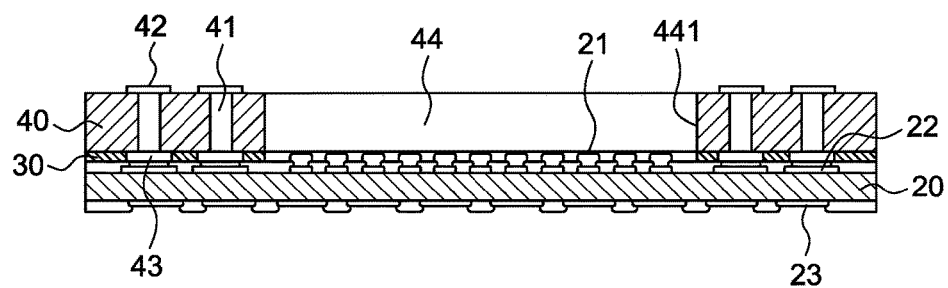
FIG. 3C is a schematic view illustrating a carrier board and a baseplate after combination according to the first embodiment of this disclosure.
Figure 3B:
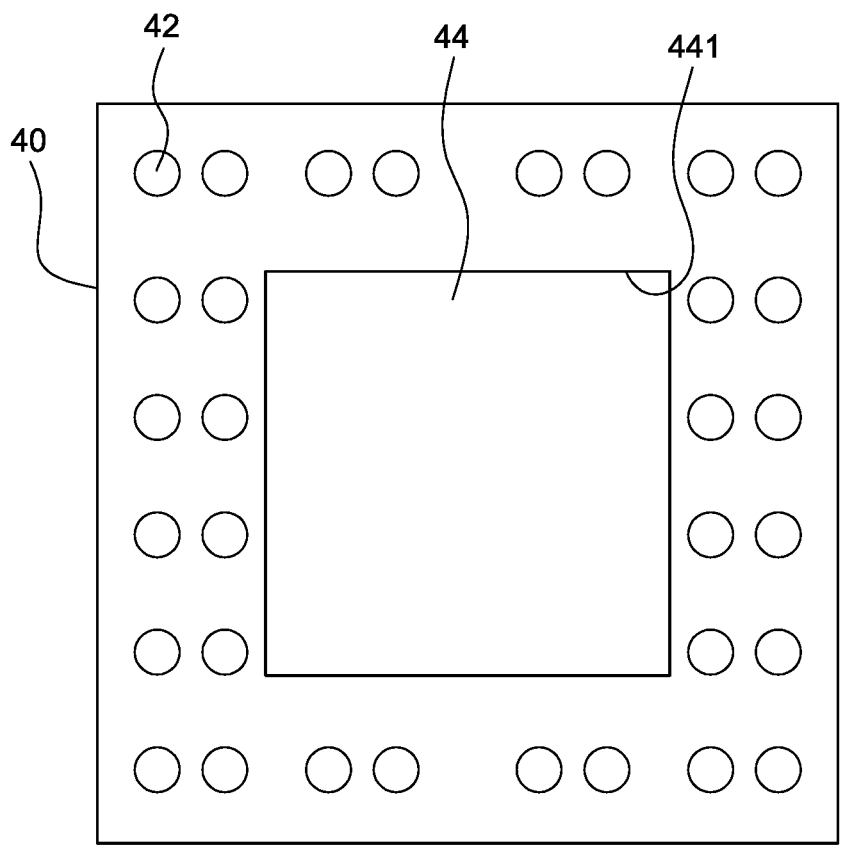
FIG. 3B is a top plan view of the baseplate in FIG. 3A.

With the referenced FIGS. 3A-3C, a carrier board and a baseplate before and after combination belongs to the carrier board process, including:

a) providing a carrier board 20 with a thickness less than 150 um, having a plurality of first and second contact points 21, 22 at an upper surface thereof, and a plurality of third contact points 23 at a lower surface thereof. The second contact points 22 are located around the first contact points 21.

b) providing a baseplate 40 which is a dot-matrix board, a baseplate with low Coefficient of Thermal Expansion, a carbon composite substrate, or a ceramic substrate. It has a plurality of electrical conductive bodies 41 passing therethrough and a penetrating rectangular opening 44 at the center thereof, forming a plurality of surrounding walls 441. The electrical conductive bodies 41 have upper and lower ends respectively exposed at an upper surface and lower surface of the baseplate 40 and electrically connected to lower surfaces of a plurality of first electrode pads 42 and upper surfaces of a plurality of second electrode pads 43.

c) providing a non-conductive film 30, having an upper surface 31 bonded to the lower surface 45 of the baseplate 40 with a fitting shape. The second electrode pads 43 each has a lower surface corresponding to position of each second contact points 22 for electronical connection therewith, and the first contact points 21 are located in the opening 44, bonding a lower surface 32 of the non-conductive film 30 to the upper surface 24 of the carrier board 20.

Figure 3D:
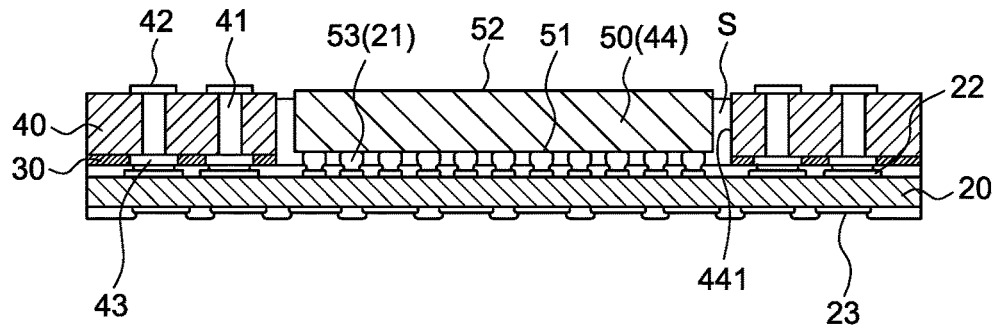
FIG. 3D is a schematic view of the first embodiment after combining with a die.
Figure 3E:
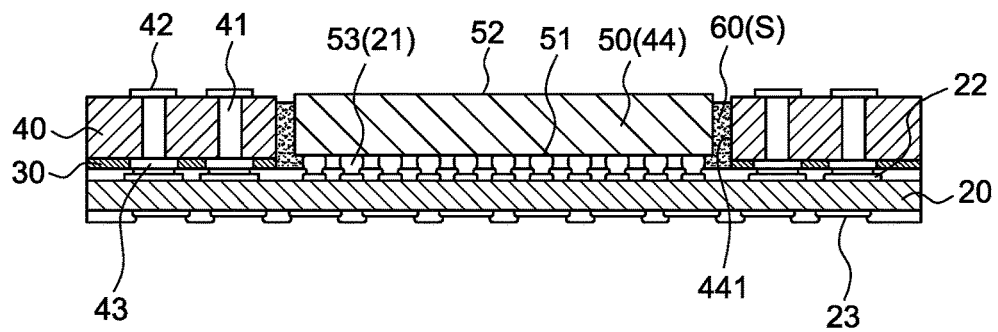
FIG. 3E is a schematic view of package molding according to the first embodiment of this disclosure.
Figure 3F:
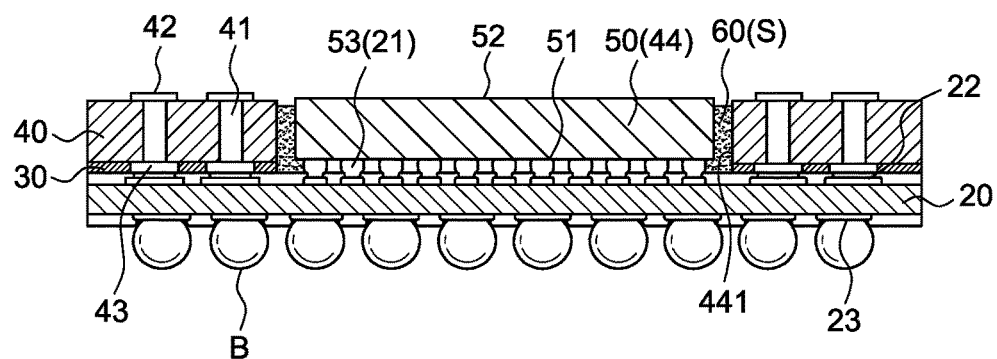
FIG. 3F is a structure schematic view of solder balls bonded to the package molding according to the first embodiment of this disclosure.

With the referenced FIGS. 3D-3F, a package molding and a structure thereof belongs to a package process, including:

d) providing at least one die 50 with an active surface 51 and a corresponding non-active surface 52. The active surface 51 has a plurality of dumps 53 connected to the first contact points 21.

e) providing a sealant material 60 filled in a gap S between the surrounding walls 441 of the opening 44 and the die 50 at a height lower than the die 50 to fixedly place the die 50 within the opening 44 and leave the non-active surface 52 exposed; also, providing a plurality of solder balls B, each bonded to a third contact point 23.

In the embodiment, the compound carrier board structure has a mechanical strength after the carrier board process, including a carrier board 20 having a plurality of first and second contact points 21, 22 at an upper surface thereof and a plurality of third contact points 23 at a lower surface thereof, and the second contact point 22 located around the first contact point 21; and a baseplate 40 having a plurality of electrical conductive bodies 41 passing therethrough and an opening 44, and the electrical conductive bodies 41 having upper and lower ends respectively exposed to an upper surface and lower surface of the baseplate 40 and electrically connected to lower surfaces of a plurality of first electrode pads 42 and upper surfaces of a plurality of second electrode pads 43; a non-conductive film 30 having an upper surface 31 bonded to the lower surface 45 of the baseplate 40. The second electrode pads 43 each has a lower surface corresponding to position of each second contact points 22 for electronical connection therewith, and the first contact points 21 are located in the opening 44, bonding a lower surface 32 of the non-conductive film 30 to the upper surface 24 of the carrier board 20.

In the embodiment, the material of the baseplate 40 is low Coefficient of Thermal Expansion and may be a carbon composite substrate or ceramic substrate for the thin carrier board 20 below 150 um being less susceptible to the thermal stress, leading to warpage problems during the package process. A die 50 implanted into the opening 44 of the compound carrier board structure has corresponding active surface 51 and non-active surface 52. The active surface 51 has a plurality of dumps 53 connected to the first contact point 21 and a sealant material 60 is filled in a gap between the opening 44 and the die 50 for fixing the die 50 to the opening 44 to form an exposed state of the non-active surface 52. Further, a plurality of solder balls B is mounted to the third contact point 23.

Figure 4A:
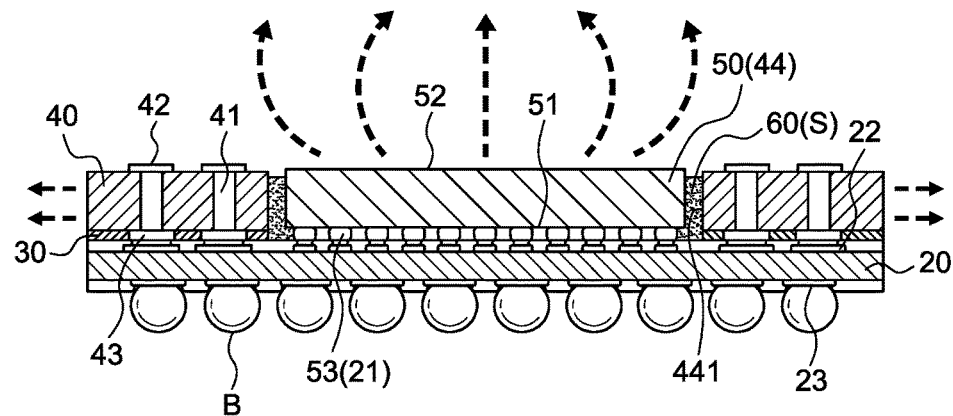
FIG. 4A is a schematic view of the thermal conduction and convention of a packaging die according to the first embodiment of this disclosure.
Figure 4B:
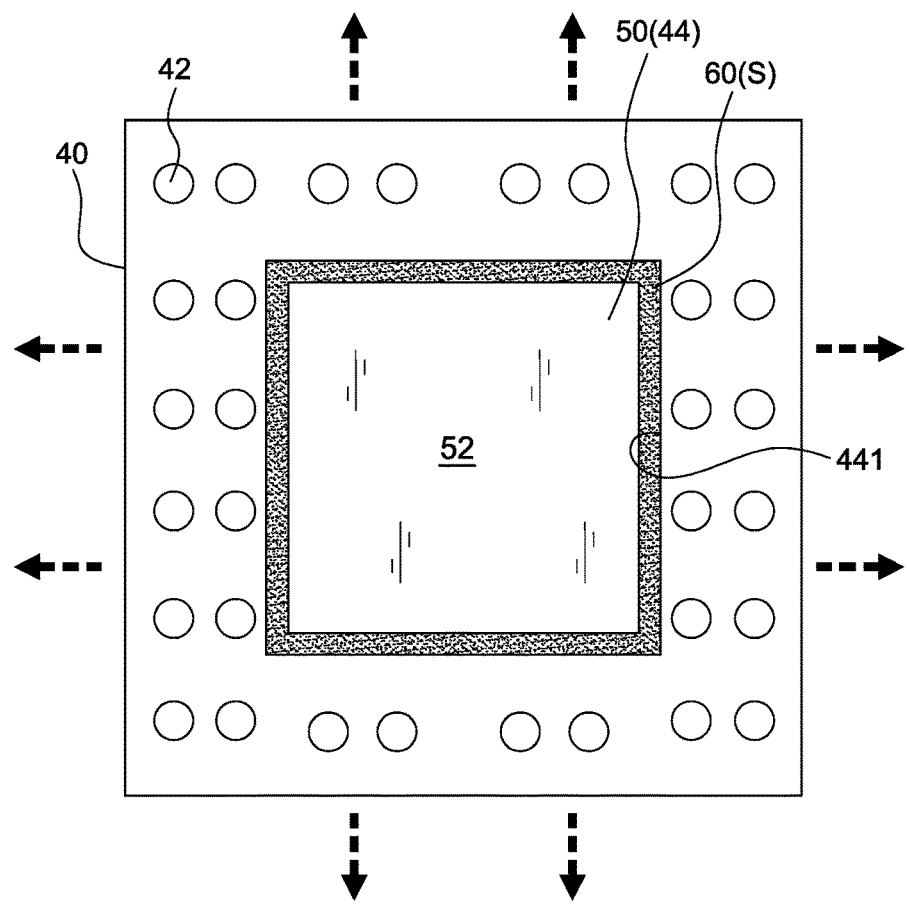
FIG. 4B is a schematic view along line 4B-4B in FIG. 4A.

With reference to FIGS. 4A and 4B, when the die 50 accepts a hot-pressing of the package process, the heat is generated in the opening 44. The baseplate 40 with low Coefficient of Thermal Expansion is able to withstand the thermal stress caused by the thermal conduction to avoid a thermal expansion arising from the thermal convection focused on the carrier board 20 while the baseplate 40, non-conductive film 30 and compound structure strength of carrier board 20 are able to withstand the thermal stress. At the same time, an open area above the opening 44 is able to accelerate the thermal convection. Thus, through the good thermal conduction and convection, the heat generated from the carrier board 20 during the package process can be rapidly eliminated, solving the warpage problems of the carrier board 20 results from the thermal stresses.

In an applicable embodiment, the baseplate 40 may be a dot-matrix board not only providing a single layer but multiple layers by using different materials. Through a drill and laser processing, the baseplate 40 provides shapes of through holes, blind holes, buried holes, semi-through holes and etc. therein and the electrical conductive bodies 41 are filled in the different holes by electroplating method. The electrical conductive body 41 may be a copper structure to present a void-free state and therefore the electrical conductive body 41 may be in a through-hole shape, blind-hole shape, buried-hole shape or semi-through-hole shape to conduct different combinations for the baseplate 40 presenting different structures but it is not a limitation.

Figure 5:
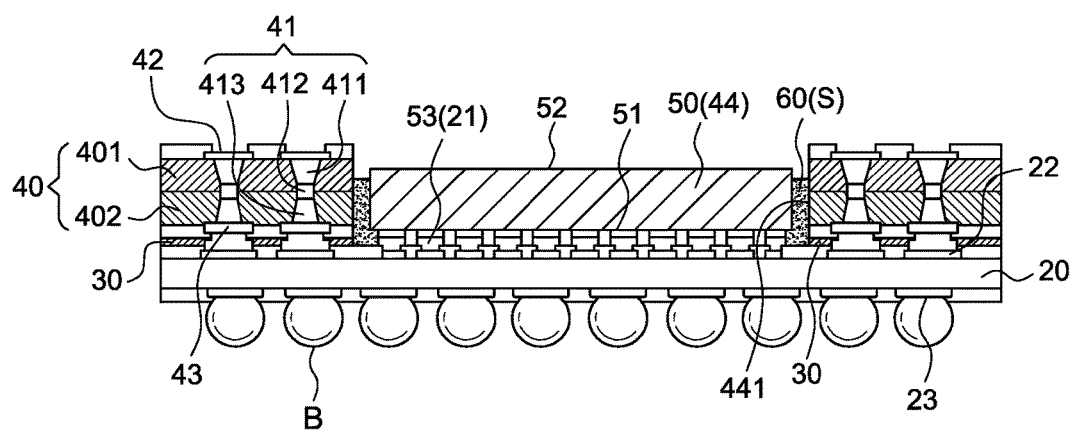
FIG. 5 is a structure schematic view of a second embodiment in accordance with this disclosure.

In a second embodiment as shown in FIG. 5, the baseplate 40 is formed by combination of a first layer 401 and a second layer 402, and each electrical conductive body 41 has an upper conductor 411 in a blind-hole shape, a middle conductor 412 in a buried-hole shape and a lower conductor 413 in a blind-hole shape. The upper conductors 411 are located at the first layer 401, the lower conductors 413 are located at the second layer 402, and the middle conductors 412 are located between the first and second layers 401, 402.

Referring to FIGS. 6A, 6B, 6C and 6D, a compound carrier board structure of Flip-Chip Chip-Scale Package and manufacturing method thereof in accordance with a third embodiment of this disclosure is divided into a carrier board process and a package process.

With referenced FIGS. 6A, 6B, 6C and 6D, a carrier board 20, anisotropic conductive film 70, and a base plate 40 before and after combination belongs to the carrier board process, including:

a) providing a carrier board 20 with a thickness less than 150 um. The carrier board 20 has a plurality of first contact points 21 and a plurality of second contact points 22 at an upper surface of the carrier board 20, and a plurality of third contact points 23 at a lower surface of the carrier board 20. The second contact points 22 are located around the first contact points 21.

a1) providing an anisotropic conductive film 70 onto the upper surface of the carrier board 20. The anisotropic conductive film 70 has a plurality of conductive particles 71 distributed therein at mutually spaced positions. Portions of the anisotropic conductive film being compressed is electrical conductive while the other portions uncompressed remains electrical non-conductive.

b) providing a baseplate 40 which is a dot-matrix board, a baseplate with low Coefficient of Thermal Expansion, a carbon composite substrate, or a ceramic substrate. The baseplate 40 has a plurality of electrical conductive bodies 41 passing therethrough and an opening 44 penetrating the baseplate 40 at the center of baseplate 40, so as to form a plurality of surrounding walls 441 within the opening 44. In one or more embodiments, the opening 44 is rectangular. The electrical conductive bodies 41 have upper and lower ends respectively exposed at an upper surface and lower surface of the baseplate 40, and electrically connected to lower surfaces of a plurality of first electrode pads 42 and upper surfaces of a plurality of second electrode pads 43.

With referenced to FIGS. 6A, 6B, 6C and 6D, the combination of baseplate 40 and the carrier board 20 is achieved by using the anisotropic conductive film 70.

b1) pressing the baseplate 40 against the anisotropic conductive film 70 with the lower surfaces of the second electrode pads 43 aligned with the second contact points 22 respectively, to allow the anisotropic conductive film 70 having portions compressed between the second electrode points 22 of the carrier board 20 and the second electrode pads 43 of the baseplate 40.

Figure 7A:
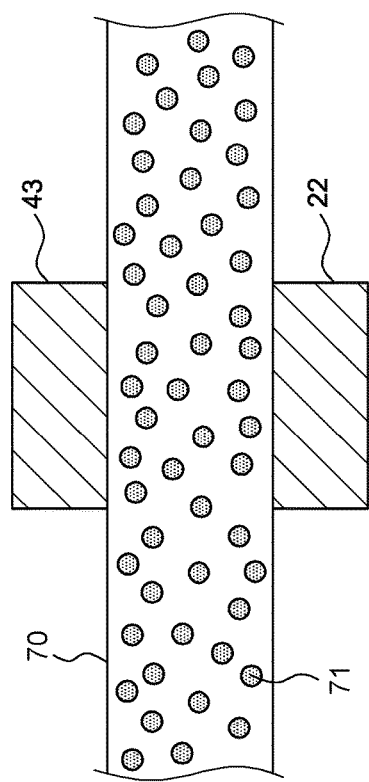
FIG. 7A is a schematic diagram illustrating the anisotropic conductive film before compression according to the third embodiment of this disclosure.
Figure 7B:
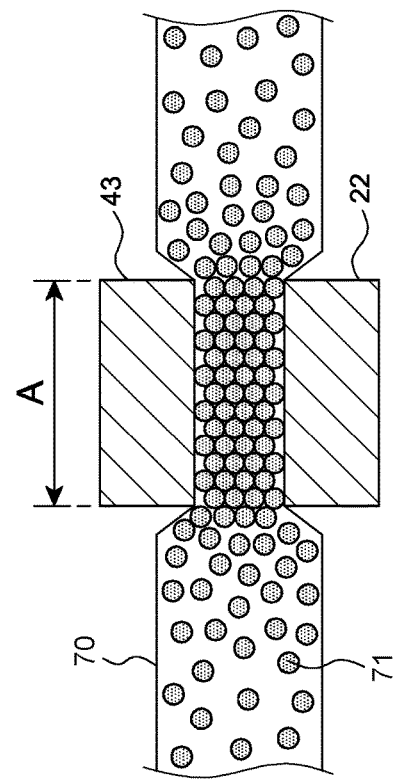
FIG. 7B is a schematic diagram illustrating the anisotropic conductive film after compression according to the third embodiment of this disclosure.

Please referring to FIGS. 7A and 7B, the compression forms a plurality of high-density compressed areas A between the second electrode points 22 of the carrier board 20 and the second electrode pads 43 of the baseplate 40. The conductive particles 71 within each high-density compressed area A are burst from distributed positions thereof in the anisotropic conductive film 70 to bunch together at a density substantially between 2500~5000 pcs/mm², the conductive particles 71 thereby form a conducting film between corresponding ones of the second electrode point 22 and the second electrode pad 43, to electrically connect the second points 22 to the second electrode pad 43. The conductive particles outside the high-density compressed areas A remaining unburst in position within the anisotropic conductive film 70 to remain insulation of the areas A of the anisotropic conductive film 70 outside the high-density compressed area A, so as to form an insulating layer between the bottom surface of the baseplate 40 and the upper surface of the carrier board 20.

Therefore, in third embodiment, the non-conductive film 30 is not required and is replaced by the anisotropic conductive film 70 outside the high-density compressed area A.

Figure 6C:
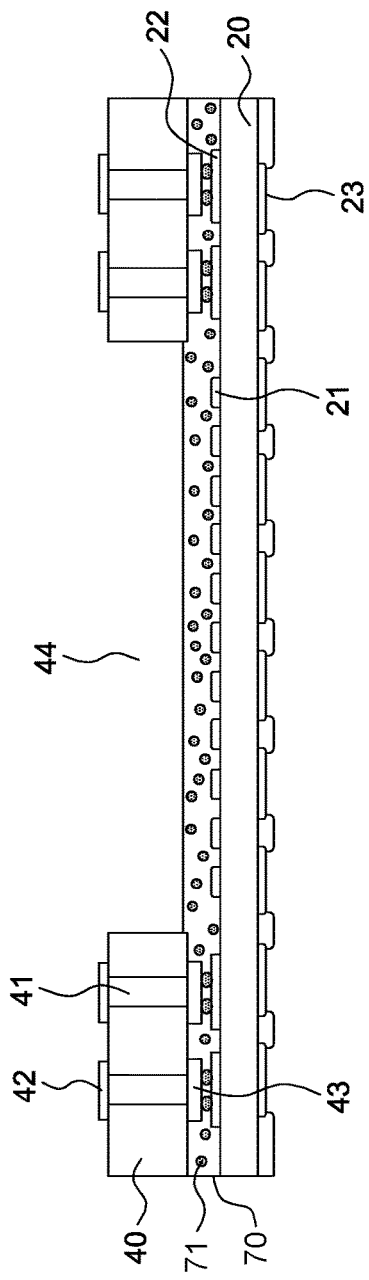
FIG. 6C is a schematic view illustrating a carrier board, an anisotropic conductive film and a baseplate after combination according to the third embodiment of this disclosure.

Furthermore, as shown in FIG. 6C the surrounding walls 441 of the opening 44 are arranged around the first contact points 21.

Figure 6D:
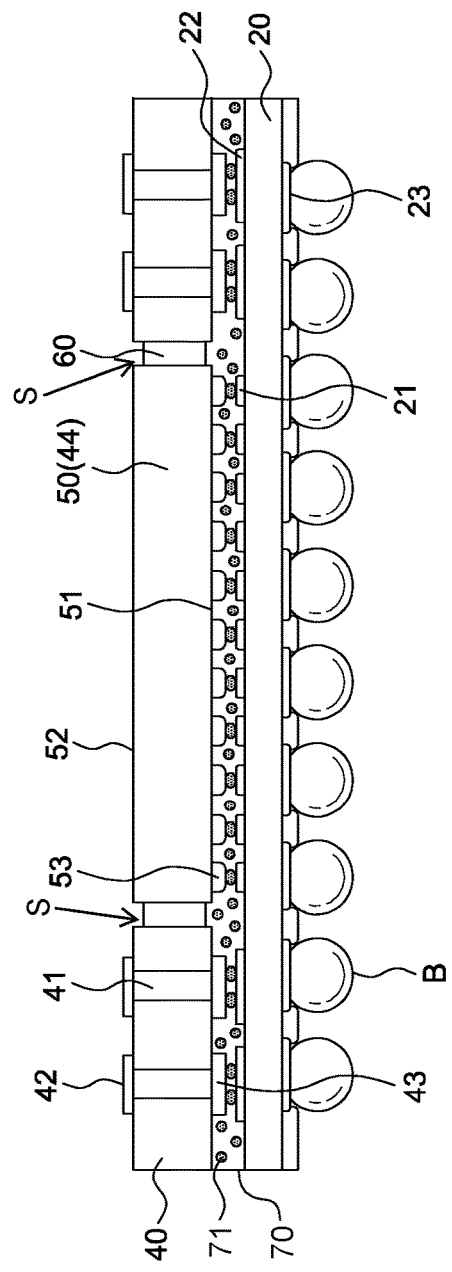
FIG. 6D is a schematic view of a compound carrier board structure according to the third embodiment of this disclosure.

With the referenced FIG. 6D, a package molding and a structure thereof belongs to a package process, including:

d) providing at least one die 50 with an active surface 51 and a corresponding non-active surface 52. The active surface 51 has a plurality of dumps 53.

d1) pressing the die 50 into the opening 44 of the baseplate 40 and against the anisotropic conductive film 70 with the dumps 53 aligned with the first contact points 21 respectively, to allow the anisotropic conductive film 70 having portions compressed between the first electrode point 21 of the carrier board 20 and the dumps 53 of the die 50

Similarly, the compression also forms the high-density compressed areas A as shown in FIG. 7B between the first electrode point 21 of the carrier board 20 and the dumps 53 of the die 50, so as to electrically connect the first electrode point 21 of the carrier board 20 to the dumps 53 of the die 50.

It is noted that step b1 (pressing the baseplate 40) and step c1 (pressing the die 50) can be performed sequentially, or the two steps can be performed simultaneously after step b and step d have been performed.

Furthermore, the surrounding walls 441 of the opening 44 are arranged around the die 50 after the die 50 is mounted onto the baseplate 40, and a gap S is formed between the surrounding walls 441 and the die 50.

Therefore, in third embodiment, welding process and welder are not required and are replaced by the high-density compressed area A of the anisotropic conductive film 70.

After bonding the carrier board 20, the anisotropic conductive film 70, the baseplate 40, and the die 50, a set of preferred process parameters are set to ensure insulation. For instance, the thickness of the anisotropic conductive film 70 is between 30 μm and 40 μm, and the conductive particles 71 are nickel- and gold-plated particles with a diameter of 5 μm and the density between each is 2500~5000 pcs/mm²; the anisotropic conductive film 70 is compressed onto the carrier board 20 under the process parameters of 70° C.~90° C., 1 MPa, and 1 second, then the baseplate 40 is compressed thereon under the process parameters of 150° C.~220° C., 2~4 MPa, and 1~10 seconds; Each second electrode pad 43 has a distance within 50 μm with other ones so that the conductive particles 71 between the bottom surface of the second electrode pads 43 and the upper surface of the second contact points 21 would have a contact area of at least 50000 μm with the conductive particles 71.

e) finally providing a sealant material 60 filled in a gap S between the surrounding walls 441 of the opening 44 and the die 50 at a height lower than the die 50 to fixedly place the die 50 within the opening 44 and leave the non-active surface 52 exposed; also, providing a plurality of solder balls B respectively bonded to each of the third contact point 23.

Referring to FIG. 6D, after the carrier board process, the compound carrier board structure comprises a carrier board 20, a baseplate 40, and an anisotropic conductive film 70.

Figure 8:
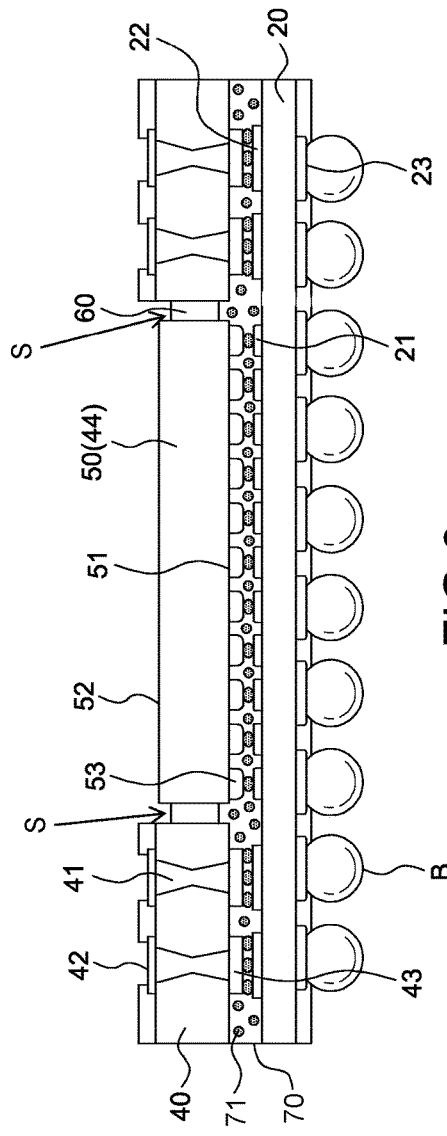
FIG. 8 is a schematic view of a compound carrier board structure according to a fourth embodiment of this disclosure.

FIG. 8 illustrates the structure of a fourth embodiment. The through-hole shape of the electrical conductive bodies 41 is a symmetrical frustum with wider upper and lower ends.

Figure 9:
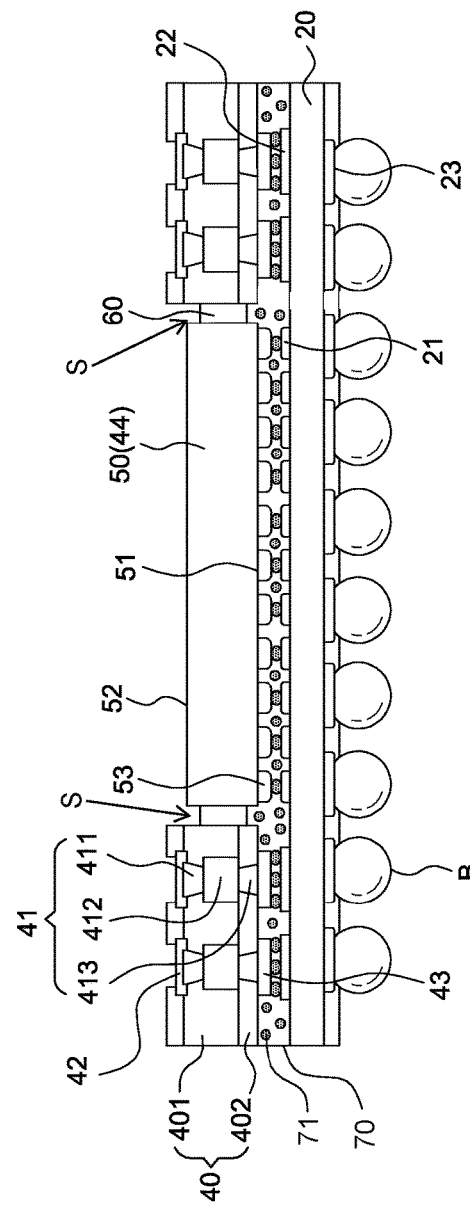
FIG. 9 is a schematic view of a compound carrier board structure according to a fifth embodiment of this disclosure.

FIG. 9 illustrates shows another structure of a fifth embodiment. The baseplate 40 is formed by the combination of a first layer 401 and a second layer 402. The electrical conductive bodies 41 have an upper part 411 arranged in a blind-hole shape, a middle part 412 arranged in a buried-hole shape, and a lower part 413 arranged in a blind-hole shape; the upper part 411 and middle part 412 are disposed in the first layer 401 and the lower part 413 is in the second layer 402.

Figure 10:
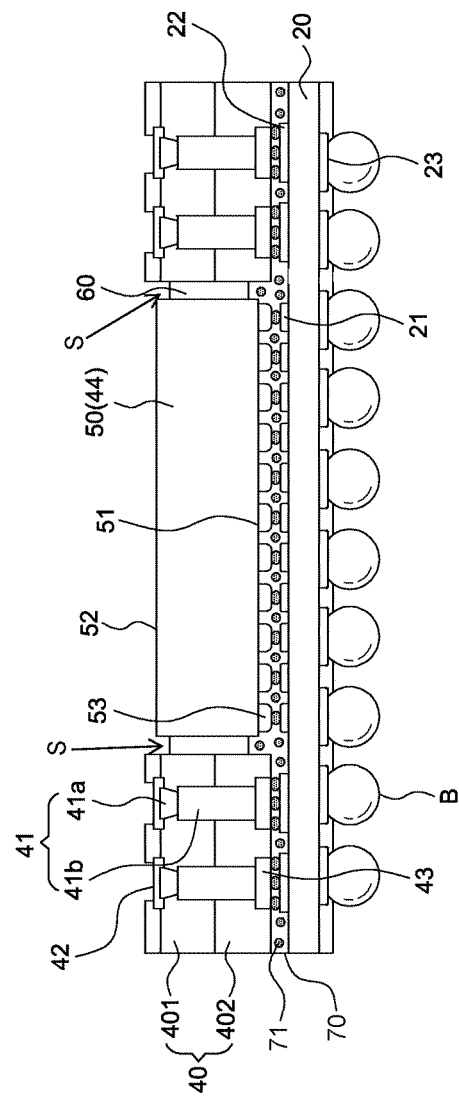
FIG. 10 is a schematic view of a compound carrier board structure according to a sixth embodiment of this disclosure.

Referring to FIG. 10, the structure of a sixth embodiment, each electrical conductive body 41 includes a first conductor 41a arranged in a blind-hole shape and a second conductor 41b arranged in a semi-through-hole shape. The first conductor 41a is in the first layer 401 and the second conductor 41b is between the first and second layer 401, 402; and the thickness of the first and second layer 401, 402 in total is more than 250 μm but is not limited to such application.

In conclusion, in third to sixth embodiment, the anisotropic conductive film 70 replaces the conventional insulating layer 30A but still has the thin feature and effectiveness of mechanical enhancement, heat dissipating enhancement and less curving. Meanwhile, having the conductive particles 71 in the an anisotropic conductive film 70 replacing the conductive openings manufactured on the insulating layer 30A in the prior art can also reduce the costs and time for manufacture process and provide better insulation.

Based on the features disclosed, this disclosure has features described as following.

1. The non-conductive film 30 is combined with the carrier board 20 and the baseplate 40 by the upper and lower surfaces 31, 32 Then the opening 44 has the die 50 fixedly disposed therein by the sealant material 60 filled within the gap S between the surrounding walls 441 and the die 50 to leave the non-active surface 52 exposed, so as to form a compound carrier board structure. Due to the exposed surface, this disclosure is able to enhance mechanical strength efficiently than a conventional chip buried in resin within an opening, and to be applied to thin cores less than 150 um to increase layers and coreless carrier boards made by all layer build up method.

2. This disclosure has the dot-matrix board as the baseplate 40, using low Thermal Expansion Coefficient material to avoid warpage problems caused by the thermal expansion of the carrier board 20 resulting from the thermal stresses. The carrier board 20 is able to disperse conduction of thermal stresses by the baseplate 40 in order to strengthen cooling effect of the compound carrier board structure.

3. The design of the baseplate 40 not only retains bonding function of Package in Package but also simplify the package process to replace complex Through Mold Via process. In summary, this disclosure achieves miniaturization and heat strengthening and enhances the mechanical strength.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A manufacturing method of the compound carrier board structure of Flip-Chip Chip-Scale Package, comprising:
 providing a carrier board with a thickness less than 150 um, having a plurality of first and second contact points at an upper surface thereof, the second contact points being located around the first contact points;
 providing an anisotropic conductive film onto the upper surface of the carrier board, wherein the anisotropic conductive film having a plurality of conductive particles distributed therein at mutually spaced positions, and portions of the anisotropic conductive film being compressed is conductive while the other portions being uncompressed remains non-conductive;
 providing a baseplate, having a plurality of electrical conductive bodies passing therethrough and an opening the baseplate at the center of the baseplate, forming a plurality of surrounding walls within the opening, the electrical conductive bodies having upper and lower ends respectively exposed at an upper surface and lower surface of the baseplate and electrically connected to lower surfaces of a plurality of first electrode pads and upper surfaces of a plurality of second electrode pads;
 pressing the baseplate against the anisotropic conductive film with the lower surfaces of the second electrode pads aligned with the second contact points respectively, to allow the anisotropic conductive film having portions compressed between the second electrode points of the carrier board and the second electrode pads of the baseplate, and the surrounding walls of the opening arranged around the first contact points;
 providing at least one die having an active surface and a corresponding non-active surface;
 pressing the die into the opening of the baseplate and against the anisotropic conductive film with the dumps aligned with the first contact points respectively, to allow the anisotropic conductive film having portions compressed between the first electrode point of the carrier board and the dumps of the die; and
 providing a sealant material filled in a gap between the surrounding walls of the opening and the die at a height lower than the die to fixedly place the die within the opening and to leave the non-active surface exposed.

2. The manufacturing method as claimed in claim 1, wherein the carrier board has a plurality of third contact points at a lower surface of the carrier board and the method further comprising step of further comprising step of providing a plurality of solder balls bonded to each of the third contact points respectively.

3. The manufacturing method as claimed in claim 1, wherein the baseplate is a dot-matrix board, a baseplate with low Coefficient of Thermal Expansion, a carbon composite substrate, or a ceramic substrate.

4. The manufacturing method as claimed in claim 1, wherein the opening is rectangular.

5. The manufacturing method as claimed in claim 1, wherein the electrical conductive bodies are configured in through-hole shape.

6. The manufacturing method as claimed in claim 5, wherein the through-hole shape is a symmetrical frustum with wider upper and lower ends.

7. The manufacturing method as claimed in claim 1, wherein the baseplate is formed by the combination of a first layer and a second layer.

8. The manufacturing method as claimed in claim 7, wherein each of the electrical conductive bodies has an upper part arranged in a blind-hole shape, a middle part arranged in a buried-hole shape, and a lower part arranged in a blind-hole shape; the upper part and middle part disposed in the first layer and the lower part is in the second layer.

9. The manufacturing method as claimed in claim 8, wherein each of the electrical conductive bodies has a first conductor arranged in a blind-hole shape and a second conductor arranged in a semi-through-hole shape; the first conductor is in the first layer and the second conductor is between the first and second layer.

10. A compound carrier board structure of Flip-Chip Chip-Scale Package, comprising:
 a carrier board with a thickness less than 150 um, having a plurality of first and second contact points at an upper surface thereof, the second contact points being located around the first contact points;
 an anisotropic conductive film disposed onto the upper surface of the carrier board having a plurality of conductive particles distributed in the anisotropic conductive film at mutually spaced positions; wherein portions of the anisotropic conductive film being compressed is electrical conductive while the other portions being uncompressed remains electrical non-conductive;
 a baseplate, having a plurality of electrical conductive bodies passing therethrough and an opening the baseplate at the center of the baseplate, forming a plurality of surrounding walls within the opening, the electrical conductive bodies having upper and lower ends respectively exposed at an upper surface and lower surface of the baseplate and electrically connected to lower surfaces of a plurality of first electrode pads and upper surfaces of a plurality of second electrode pads; wherein the baseplate is compressed against the anisotropic conductive film with the lower surfaces of the second electrode pads aligned with the second contact points respectively, to allow the anisotropic conductive film having portions compressed between the second electrode points of the carrier board and the second electrode pads of the baseplate, and the surrounding walls of the opening arranged around the first contact points;
 at least one die having an active surface having a plurality of dumps and a corresponding non-active surface; wherein the die is compressed into the opening of the baseplate and against the anisotropic conductive film with the dumps aligned with the first contact points respectively, to allow the anisotropic conductive film having portions compressed between the first electrode point of the carrier board and the dumps of the die; and
 a sealant material filled in a gap between the surrounding walls of the opening and the die at a height lower than the die to fixedly place the die within the opening and leave the non-active surface exposed.

11. The compound carrier board structure as claimed in claim 10, wherein the carrier board has a plurality of third contact points at a lower surface of the carrier board and the method further comprising step of further comprising step of providing a plurality of solder balls bonded to each of the third contact points respectively.

12. The compound carrier board structure as claimed in claim 10, wherein the baseplate is a dot-matrix board, a baseplate with low Coefficient of Thermal Expansion, a carbon composite substrate, or a ceramic substrate.

13. The compound carrier board structure as claimed in claim 10, wherein the opening is rectangular.

14. The compound carrier board structure as claimed in claim 10, the electrical conductive bodies are configured in through-hole shape.

15. The compound carrier board structure as claimed in claim 10, wherein the through-hole shape is a symmetrical frustum with wider upper and lower ends.

16. The compound carrier board structure as claimed in claim 10, wherein the baseplate is formed by the combination of a first layer and a second layer.

17. The compound carrier board structure as claimed in claim 16, wherein each of the electrical conductive bodies has an upper part arranged in a blind-hole shape, a middle part arranged in a buried-hole shape, and a lower part arranged in a blind-hole shape; the upper part and middle part disposed in the first layer and the lower part is in the second layer.

18. The compound carrier board structure as claimed in claim 16, wherein each of the electrical conductive bodies has a first conductor arranged in a blind-hole shape and a second conductor arranged in a semi-through-hole shape; the first conductor is in the first layer and the second conductor is between the first and second layer.

* * * * *